United States Patent [19]

Kurihara

[11] Patent Number: 4,488,123
[45] Date of Patent: Dec. 11, 1984

[54] FREQUENCY SYNTHESIZER

[75] Inventor: Takenori Kurihara, Gyoda, Japan

[73] Assignee: Takeda Riken Co., Ltd., Tokyo, Japan

[21] Appl. No.: 331,291

[22] Filed: Dec. 16, 1981

[30] Foreign Application Priority Data

Dec. 29, 1980 [JP] Japan .............................. 55-186693

[51] Int. Cl.³ .............................................. H03L 7/18
[52] U.S. Cl. .......................................... 331/2; 331/4; 331/11; 331/25; 331/47; 331/60; 328/14
[58] Field of Search ................... 331/8 R, 2, 4, 11, 18, 331/19, 25, 34, 47, 49, 60, 179; 332/16 R, 19; 328/14; 455/76, 165, 183, 260

[56] References Cited

U.S. PATENT DOCUMENTS 4,180,783 12/1979 Khalifa ................................... 331/2

Primary Examiner—John Zazworsky
Attorney, Agent, or Firm—Staas & Halsey

[57] ABSTRACT

The output from a first variable frequency oscillator is frequency divided by a variable frequency divider and the frequency-divided output is phase compared by a first phase comparator with a first reference signal. By the phase-compared output is controlled a second variable-frequency oscillator of higher frequency stability than that of the first variable frequency oscillator. The output from the first variable oscillator is frequency divided by another frequency divider and the frequency-divided output is phase compared by a second phase comparator on the basis of the output from the second variable frequency oscillator and, by the phase-compared output, the first variable frequency oscillator is controlled. By changing the frequency dividing ratio of the variable frequency divider, the oscillation frequency of the first variable frequency oscillator is set.

15 Claims, 9 Drawing Figures

FREQUENCY SYNTHESIZER

BACKGROUND OF THE INVENTION

The present invention relates to a frequency synthesizer which is used for example, for varying a received signal frequency, in a spectrum analyzer, or for supplying signals of various frequencies to a device under test, that is, used as the so-called signal generator for generating signals of various frequencies. In particular, the invention pertains to a frequency synthesizer which permits frequency variations over a wide frequency band at short intervals.

In a conventional frequency synthesizer, the output from a voltage controlled variable frequency oscillator is frequency divided by a variable frequency divider, the frequency-divided output and a reference signal are phase compared and, by the phase-compared output, the oscillation frequency of the variable frequency oscillator is controlled, bringing the output frequency of the variable frequency divider into agreement with the frequency of the reference signal. That is, the oscillation frequency of the variable frequency oscillator is altered by changing the frequency dividing ratio of the variable frequency divider. In the prior art frequency synthesizer, it is difficult, in general, to select the frequency of the reference signal low, so that it is impossible to vary the output frequency by steps of 1 Hz, for instance. Furthermore, when the frequency step is selected small, the frequency dividing factor of the variable frequency divider must be augmented markedly, which leads to a decrease in the loop gain, resulting in increased settling time in which to reach a set frequency. Besides, the compared output from the phase comparator is applied to a low-pass filter which is required to have a cutoff frequency lower than the frequency variation interval, but such a low-pass filter is difficult to produce. Moreover, for effecting frequency sweep about the set frequency, the phase-compared output is sample-held and the sample-held output and a sweep signal are superimposed on each other and then the superimposed signal is applied as a control signal to the variable frequency oscillator. In this case, as a frequency control loop is cut off, the frequency stability becomes low.

Furthermore, in the prior art, the output from a variable frequency crystal oscillator is frequency multiplied by a frequency multiplier; the multiplied output is phase compared by a phase comparator with the oscillation output from a voltage controlled variable frequency oscillator and, by the phase-compared output, the oscillation frequency of the voltage controlled variable frequency oscillator is controlled, thereby to cause the frequencies of before the inputs to the phase comparator to coincide with each other. Namely, the oscillation frequency of the voltage controlled variable frequency oscillator is changed by controlling the oscillation frequency of the crystal oscillator. In this case, even if a control signal for the crystal oscillator is set in a digital form, the oscillation frequency of the crystal oscillator does not always become as desired. Therefore, it is also necessary to prepare means for measuring the oscillation frequency of the crystal oscillator.

SUMMARY OF THE INVENTION

It is therefore an object of the present invention to provide a frequency synthesizer which permits its output frequency to be varied little by little and has a large loop gain, and settles in a short time.

Another object of the present invention is to provide a frequency synthesizer which does not call for the provision of frequency measuring means but can be set to a desired frequency and provides a signal of the set frequency and has a high degree of frequency stability.

Another object of the present invention is to provide a frequency synthesizer which is capable of stably producing a frequency sweep signal based on a set frequency.

Yet another object of the present invention is to provide a frequency synthesizer which is large in loop gain, and hence is high in frequency purity, and which is capable of changing little by little the output frequency over a wide range through the use of a variable frequency divider having a relatively small frequency dividing factor.

According to this invention, the oscillation output from a first variable frequency oscillator is frequency divided by a variable frequency divider, the frequency-divided output is phase compared by a first phase comparator with a first reference signal and by the phase-compared output is controlled the oscillation frequency of a second variable frequency oscillator which excels the first variable frequency oscillator in the frequency stability and in the linearity of the oscillation frequency variation to control signal characteristic. On the other hand, the oscillation output from the first variable frequency oscillator is frequency divided by a first frequency divider, the frequency-divided output and the output from the second variable frequency oscillator are phase compared by a second phase comparator and, by the phase-compared output, the first variable frequency oscillator is controlled. Thus, a first control loop is set up via the route: first variable frequency oscillator-variable frequency divider-first phase comparator-second variable frequency oscillator-second phase comparator-first variable frequency oscillator. By setting the frequency dividing ratio of the variable frequency divider, in the first control loop, a signal of a desired frequency can be obtained from the first variable frequency oscillator. A second control loop is similarly constituted via the route: first variable frequency oscillator-first frequency divider-second phase comparator-first variable frequency oscillator. The second control loop is controlled on the basis of the oscillation frequency of the second variable frequency oscillator.

As the frequency dividing factor of the variable frequency divider is selected as small as possible, it is possible to adopt such an arrangement in which the oscillation output from the first variable frequency oscillator is converted by a first frequency converter into a lower-frequency signal using a first local signal and the frequency-converted signal is phase compared by the first phase comparator with the first reference signal. Also it is possible to convert the oscillation output from the second variable frequency oscillator by a second frequency converter into a lower-frequency signal using a second local signal and to phase compare the frequency-converted signal and the output from the first frequency divider by the second phase comparator, thereby to enlarge the range of frequency variations relative to the center frequency.

Moreover, the second variable frequency oscillator may also be constituted by two variable frequency oscillator means the frequencies of which vary in opposite directions by a control signal, wherein a signal of the difference frequency between the outputs from the two variable frequency oscillator means is obtained by frequency converter means. With such an arrangement, the frequency variation range can be enlarged without employing the aforesaid second local signal and second frequency converter. In addition to this, the frequency synthesizer in this case has a wide range of linearity of its frequency variation vs. control signal characteristic, a high degree of stability for temperature change and high Q.

Besides, it is possible to sweep the frequency of the output signal on the basis of a set frequency by sample-holding the output from the second phase comparator to cut off the first control loop, superimposing a sweep control signal on the sample-hold output and applying the superimposed signal as a control signal to the second variable frequency oscillator. Signals can be taken out from the first variable frequency oscillator, the second variable frequency oscillator, the first frequency converter, the second frequency converter and any of intermediate frequency dividing stages of the first frequency divider, and the signals can also be taken out by selectively switching between them. In such a case, by selecting the converting frequency and the frequency dividing stage from which the output is derived, the output frequency can be varied at various intervals with respect to the same center frequency.

DESCRIPTION OF THE PREFERRED EMBODIMENTS

To facilitate a better understanding of the present invention, a description will be given first, with reference to FIG. 1, of an example of a device to which the frequency synthesizer of the present invention is applied and, with reference to FIGS. 2 to 4, of prior art examples and a device which can be deduced from the prior art.

Figure 1:
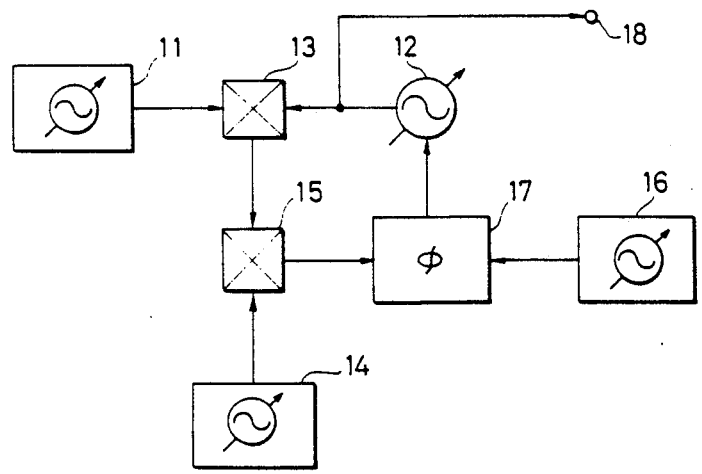
FIG. 1 is a block diagram illustrating an example of the device to which the frequency synthesizer of the present invention is applied.
Figure 2:
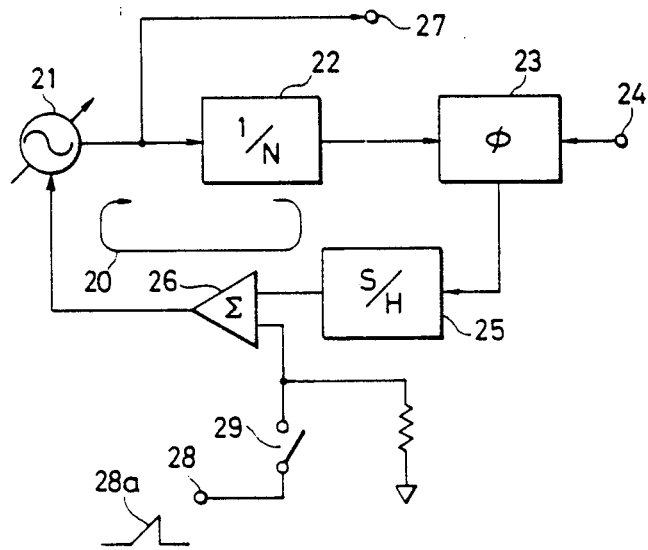
FIG. 2 is a block diagram showing a conventional frequency synthesizer.

FIG. 1 illustrates the arrangement of a local oscillator device which is employed, for example, in a spectrum analyzer for changing a received signal frequency. The oscillation output from an oscillator 11, the oscillation frequency of which is variable over a frequency range from 2000 to 4000 MHz by steps of 100 MHz, is frequency mixed by a frequency mixer 13 with the output from a variable frequency oscillator 12. The resulting frequency signal available from the frequency mixer 13 is mixed by another frequency mixer 15 with the oscillation output from an oscillator 14 the frequency of which can be controlled over a frequency range of 200 to 300 MHz at intervals of 10 KHz to 10 MHz, for instance. The mixed output is phase compared by a phase comparator 17 with the oscillation output from an oscillator 16 the frequency of which is variable over a frequency range of 20 MHz by steps of 1 Hz to 1 KHz, for example. The phase compared output is applied to the variable frequency oscillator 12 to control it. By suitably selecting the oscillation frequencies of the frequency oscillators 11, 14 and 16, the oscillation frequency of the variable frequency oscillator 12 can be varied little by little over a wide frequency range and the oscillation output from the oscillator 12 is derived at a terminal 18. This output is utilized, for example, as a local signal for frequency-converting a received signal in a spectrum analyzer.

The frequency synthesizer of the present invention is employed for changing frequency over a wide range with small increments as in the case of the oscillator 16 in FIG. 1. A conventional frequency synthesizer for such frequency variations is disclosed, for example, in U.S. Pat. No. 4,130,808 entitled "Swept Frequency Signal Source". This frequency synthesizer has such an arrangement as shown in FIG. 2 in which the output from a variable frequency oscillator 21 is frequency divided by a variable frequency divider 22 and the frequency-divided output therefrom is phase compared by a phase comparator 23 with a reference signal from a terminal 24 and the phase-compared output is applied via a sample-hold circuit 25 and an adder 26 to the variable frequency oscillator 21 to control its oscillation frequency. In this case, an oscillation output of the frequency accuracy which depends on that of the reference signal applied to the terminal 24 can be derived from the variable frequency oscillator 21 at an output terminal 27 by a phase control loop (hereinafter referred to as a PLL) 20 which is constituted by the route: oscillator 21-variable frequency divider 22-phase comparator 23-sample-hold circuit 25-adder 26-oscillator 21. By changing the frequency dividing ratio of the variable frequency divider 22, the oscillation frequency of the oscillator 21 can be varied at intervals of the frequency of the reference signal provided to the terminal 24.

In order to reduce the intervals for such frequency variations, it is necessary to lower the frequency of the reference signal from the terminal 24 and reduce the frequency dividing ratio N of the frequency divider 22. With a decrease in the frequency dividing ratio N, the loop gain of the PLL 20 decreases, augmenting the settling time in which the output frequency of the oscillator 21 reaches a frequency set up by the frequency divider 22.

For continuously varying the frequency of the signal which is derived at the output terminal 27, a switch 29 is turned ON to apply therethrough a sweep signal to the adder 26 from a terminal 28. In this case, after phase synchronization is retained by the PLL 20 first, an error voltage at that time is held by the sample-hold circuit 25, and the output side of the phase comparator 23 and the input side of the sample-hold circuit 25 are cut off from each other, that is, the PLL 20 is cut off followed by the switch 29 being turned ON to provide the sweep signal to the adder 26. In consequence, the frequency of the oscillator 21 is changed by the sweep signal on the basis of the frequency of the oscillator 21 immediately before cutting off of the PLL 20. Thus the oscillation frequency of the oscillator 21 can be controlled at short intervals. In this case, however, the PLL 20 is cut off at the sample-hold circuit 25 and the frequency stability of the variable frequency oscillator 21 itself is poor, so that the frequency stability of the signal available at the output terminal 27 also becomes low.

Figure 3:
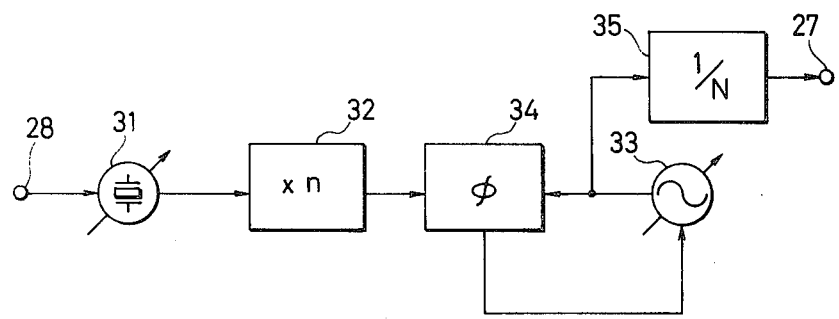
FIG. 3 is a block diagram showing another type of conventional frequency synthesizer.

FIG. 3 shows another prior art example which employs an oscillator 31 that has a high degree of frequency stability, that is, undergoes no substantial drift and is relatively excellent in the linearity between a control signal and the oscillation frequency, such as a variable frequency crystal oscillator, for example. The oscillation frequency of the oscillator 31 is controlled by the sweep signal from the terminal 28 and the output from the oscillator 31 is frequency multiplied by a frequency multiplier 32 to magnify the change in the oscillation frequency. The frequency-magnified output and the output from a variable frequency oscillator 33 are phase compared by a phase comparator 34, the phase-compared output from which is supplied to the variable frequency oscillator 33 to control its oscillation frequency. The output from the oscillator 33 is frequency divided by a frequency divider 35, providing its output at the output terminal 27.

In this case, the output signal at the terminal 27 is stable but its frequency cannot be known unless the relationship between a control voltage of the oscillator 31 and its oscillation frequency is accurately known. Accordingly, the frequency of the output signal at the terminal 27 cannot correctly be known unless a frequency measuring instrument such as a frequency counter is used for accurately measuring the oscillation frequency of the oscillator 31.

Figure 4:
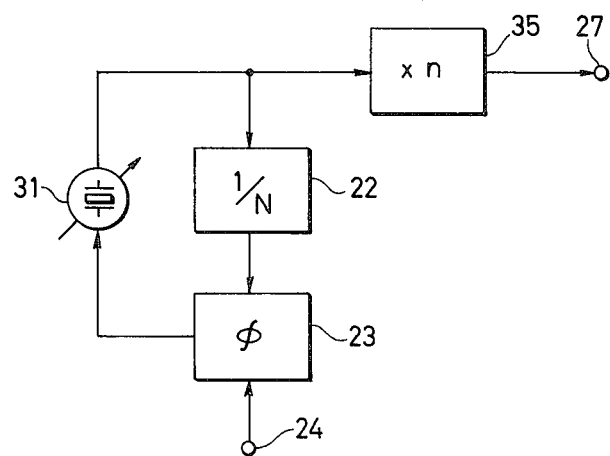
FIG. 4 is a block diagram showing a frequency synthesizer which can be deduced from the prior art.

Furthermore, it is possible to adopt such an arrangement as shown in FIG. 4 in which the output from the crystal control oscillator 31, excellent in the frequency stability as well as in the linearity of frequency variations with respect to a control signal, is frequency divided by the frequency divider 22; the frequency divided output and the reference signal from the terminal 24 are phase compared by the phase comparator 23; the phase-compared output is provided to the oscillator 31 to control it; and the output from the oscillator 31 is multiplied by a frequency multiplier 35 to provide an output at the terminal 27.

In this case, the output yielded at the output terminal 27 has high frequency stability but difficulty is encountered in reducing the intervals of frequency variations at the output terminal 27. For example, in the case where the interval of frequency variations required is 1 KHz and the multiplying factor of the frequency multiplier 35 is 100, it is necessary that the frequency of the reference signal at the terminal 24 be 10 Hz, but it is difficult to obtain such a low-frequency reference signal with a high stability. In addition, the phase of the oscillator 31 is controlled by the PLL composed of the oscillator 31, the variable frequency divider 22 and the phase comparator 23 but, in order to sufficiently increase the frequency purity of the oscillator 31, it is necessary that the cutoff frequency of a low-pass filter included in the phase comparator 23 be lowered for cutting off unnecessary frequencies, which causes an increase in the time constant. This increases the time for the PLL to become stable, that is, the so-called settling time and makes it difficult to obtain a signal of high frequency purity. Accordingly, in the case of employing a variable frequency oscillator of high frequency stability, since its frequency variation range is narrow, there arises a difficulty in widening the frequency variation range of the output signal which is derived at the output terminal 27.

Figure 5:
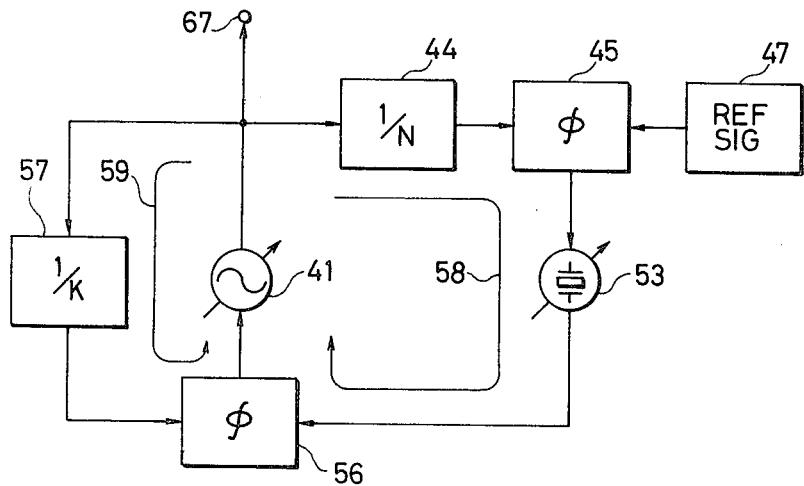
FIG. 5 is a block diagram illustrating the simplest arrangement of the frequency synthesizer of the present invention.

FIG. 5 illustrates an embodiment of the frequency synthesizer of the present invention. A first variable frequency oscillator 41 is, for instance, a voltage controlled oscillator, the frequency of which is variable over a relatively wide range, for example, ±10 MHz with respect to its center frequency 200 MHz. The first frequency variable oscillator 41 will hereinafter be referred to as the first VCO 41. The oscillation output from the first VCO 41 is supplied to an output terminal 67 and, at the same time, it is provided to a variable frequency divider 44, wherein its frequency is divided down to 1/N. The frequency dividing factor N can be set to any integer in the range of from 100000 to 300000, for instance. The frequency-divided output from the variable frequency divider 44 is phase compared by a phase comparator 45 with a reference signal from a reference signal source 47.

The output from the phase comparator 45 is applied to a second variable frequency oscillator 53 to control its oscillation frequency. The second variable frequency oscillator 53 is excellent in the frequency stability and in the linearity of its frequency variation characteristic with respect to a control signal, as compared with the first VCO 41. The second variable frequency oscillator 53 is constituted, for example, by a voltage controlled crystal oscillator and its oscillation frequency can be varied, for example, about ±10 KHz about 2 MHz. The oscillator 53 will hereinafter be referred to as the second VCO 53.

The output from the first VCO 41 is frequency divided by a frequency divider 57 down to 1/K and the output from the frequency divider 57 is phase compared by a phase comparator 56 with the output from the second VCO 53. The phase-compared output from the phase comparator 56 is fed to the first VCO 41 to control its oscillation frequency. The dividing factor K of the frequency divider 57 is, for instance, 100.

In FIG. 5 there is constituted a first phase synchronization control loop 58 [first VCO 41-variable frequency divider 44-phase comparator 45-second VCO 53-phase comparator 56-first VCO 41], which loop 58 will hereinafter be referred to as the first PLL. A second phase synchronization control loop (hereinafter referred to as the second PLL) 59 is also formed [first VCO 41-frequency divider 57-phase comparator 56-first VCO 41]. In the first PLL 58, the second VCO 53 is controlled on the basis of the frequency of the reference signal available from the reference signal source 47 and, in the second PLL 59, the first VCO 41 is controlled on the basis of the oscillation frequency of the second VCO 53. Accordingly, a small frequency variation is attained in the first PLL 58 and it is magnified in the second PLL 59; namely, frequency can be varied widely by that. By selecting the frequency dividing factor K of the frequency divider 57 to be smaller than the frequency dividing factor N of the frequency divider 44 and by selecting the loop gain of the second PLL 59 large, it is possible to obtain a signal of high frequency purity from the first VCO 41. The oscillation frequency of the first VCO 41 can be set by the frequency dividing factor N of the variable frequency divider 44; hence, there is no need of using a frequency measuring instrument. Furthermore, as the second VCO 53 is included in the first PLL 58, even in the case where the output from the phase comparator 45 is sample-held and applied to the second VCO 53 to cut off the first PLL 58 and a sweep signal is provided to the second VCO 53 to sweep the frequency of the first VCO 41, an output signal of excellent frequency stability can be obtained.

Figure 6:
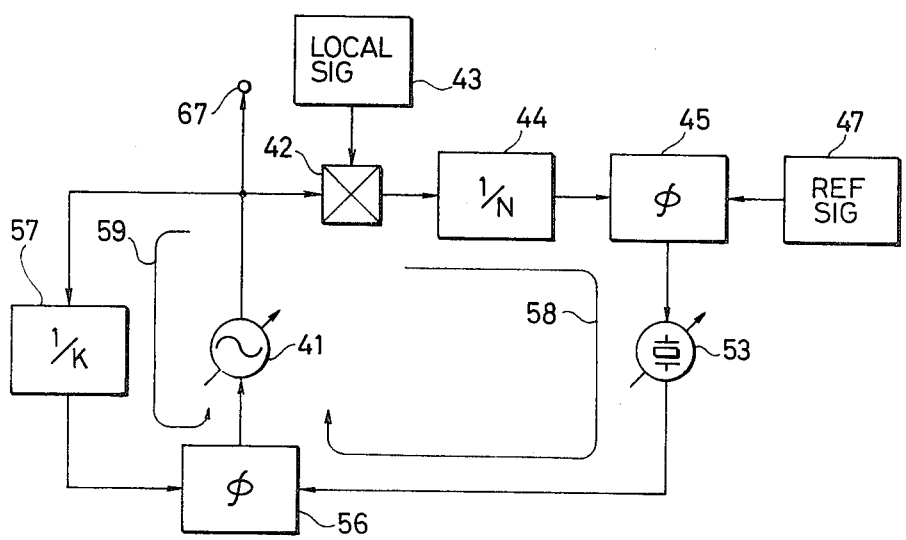
FIG. 6 is a block diagram illustrating an embodiment of the frequency synthesizer of the present invention in which the frequency dividing ratio of a variable frequency divider is selected smaller.

The embodiment of FIG. 5 has the defect that the frequency dividing factor N of the variable frequency divider 44 in the first PLL 58 should be relatively large in order to change the frequency little by little. FIG. 6 illustrates another embodiment of the present invention which is intended to offer a solution to such a drawback. In FIG. 6 the parts corresponding to those in FIG. 5 are identified by the same reference numerals. With this embodiment, the oscillation output from the first VCO 41 is frequency converted by a frequency converter 42 into a lower-frequency signal using a local signal from a local signal source 43 and the frequency-converted signal is fed to the variable frequency divider 44. This embodiment is identical in construction with the embodiment of FIG. 5 except in the above point. With such an arrangement, the frequency dividing factor N of the variable frequency divider 44 can be made smaller than that in the case of FIG. 5, permitting an increase in the loop gain of the first PLL 58 and a decrease in the settling time.

Figure 7:
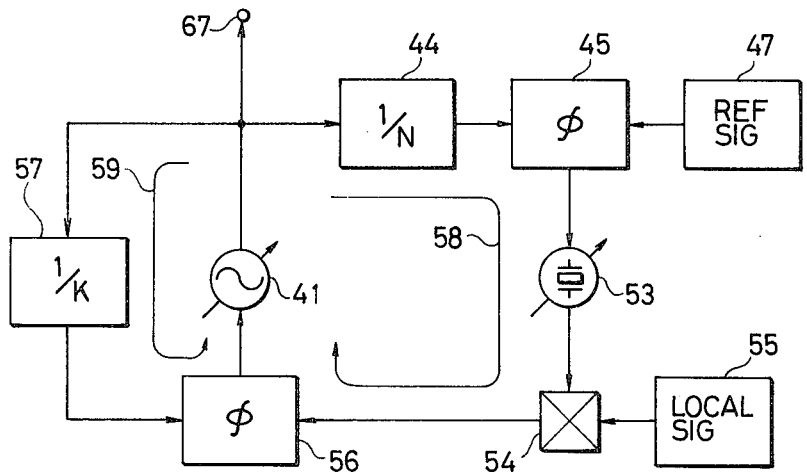
FIG. 7 is a block diagram illustrating another embodiment of the present invention in which the relative frequency variation band width of a reference signal for a second control loop is designed to be large.

In FIG. 5, since the frequency variation range with respect to the center frequency of the second VCO 53 is relatively narrow, that is, the relative band width is small, in consequence the relative band width of the output from the frequency synthesizer cannot also be made large. In view of this, for example, as shown in FIG. 7 in which the parts corresponding to those in FIG. 5 are identified by the same reference numerals, the output from the second VCO 53 is frequency converted by a frequency converter 54 into a lower-frequency signal using a local signal from a local signal source 55 and the converted signal is supplied to a phase comparator 56. With such an arrangement, as only the center frequency is lowered while retaining the frequency variation range of the output from the second VCO 53 unchanged, the relative band width is increased, making it possible to enlarge the frequency variation range of the first VCO 41.

Figure 8:
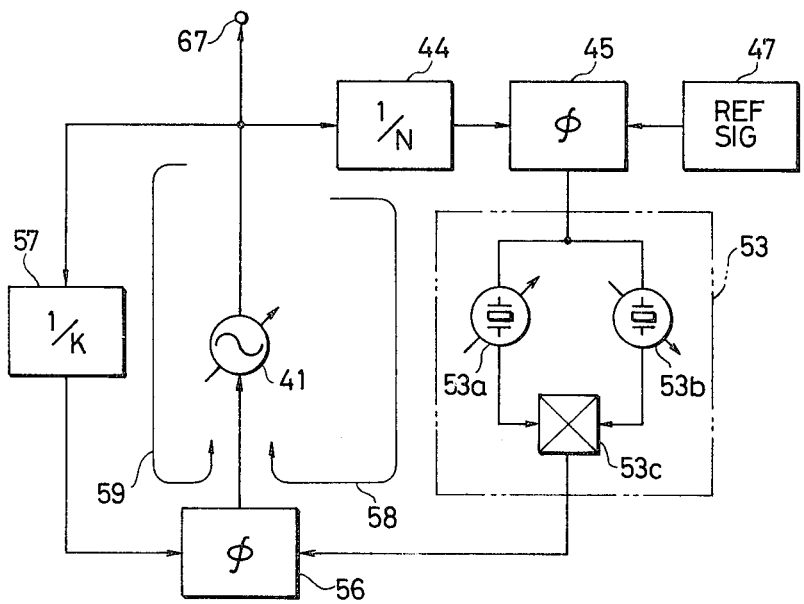
FIG. 8 is a block diagram illustrating another embodiment of the present invention which employs a modified form of a second variable frequency oscillator.

The relative band width can also be increased by an arrangement such, for example, as depicted in FIG. 8. In this embodiment, the second VCO 53 includes two voltage controlled oscillators 53a and 53b the oscillation frequencies of which vary in opposite directions in such a manner that one of them increases, whereas the other decreases. The oscillators 53a and 53b are concurrently controlled by the output from the phase comparator 45. The oscillation outputs from the oscillators 53a and 53b are converted by a frequency converter 53c into a signal of the difference frequency between the both oscillation outputs, and this signal is used as the output from the second VCO 53. With such an arrangement, nonlinearities of the oscillation frequency-control voltage characteristics of the oscillators 53a and 53b are compensated for each other, providing an enlarged linear range of the control voltage-oscillation frequency characteristic. In addition, as the frequency is lowered by the frequency converter 53c, the oscillation frequencies of the oscillators 53a and 53b can be raised and, as a result of this, the linear ranges of their control voltage-oscillation frequency characteristics can be increased. For example, when the oscillation frequencies of the oscillators 53a and 53b are 21.2 MHz ±5 KHz and 19.2 MHz ±5 KHz, respectively, the output frequency of the frequency converter 53c is 2 MHz ±10 KHz.

It is also possible to obtain a more preferred frequency synthesizer by combining two to four arrangements of FIGS. 5 to 8.

Figure 9:
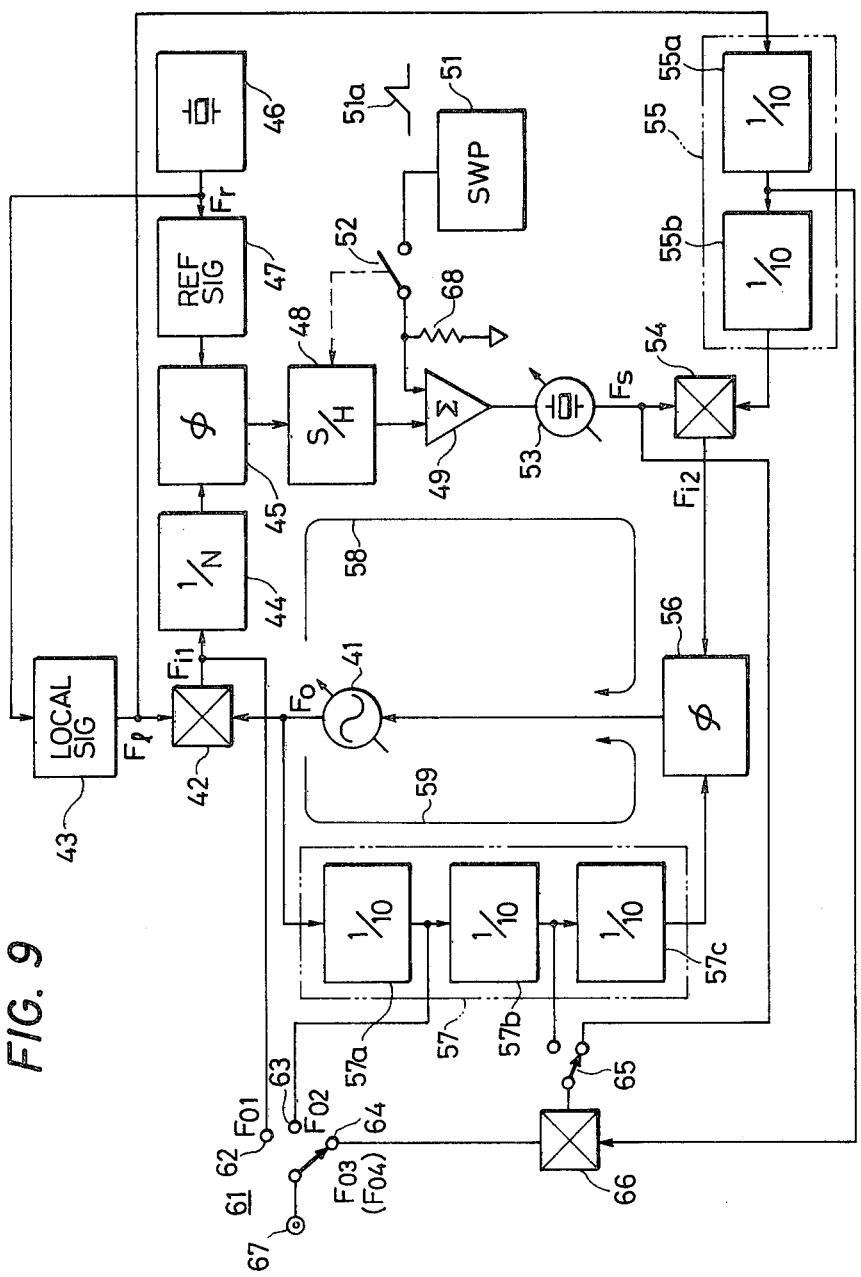
FIG. 9 is a block diagram illustrating yet another embodiment of the present invention which employs the frequency synthesizers of FIGS. 6 and 7 in combination and is adapted to permit frequency sweep and to switchingly take out outputs from various parts.

FIG. 9 illustrates a specific example of the combination of the arrangements shown in FIGS. 6 and 7, which is designed so that outputs are derived from respective parts, wherein the value of each frequency variation may be used for various purposes so that, a wide frequency variation range can be obtained and various signals are available from one reference signal source.

The output from the first VCO 41 which has a frequency $F_0$ is frequency mixed by the frequency converter 42 with a local signal of a frequency $F_l$ from the local signal source 43 to yield a signal of a frequency $F_{l1}$ lower than the frequency $F_0$, which signal is supplied to the variable frequency divider 44. The frequency dividing factor N of the variable frequency divider 44 can be set, for example, in the range of from 10000 to 30000. The frequency-divided output from the variable frequency divider 44 is applied to the phase comparator 45, wherein it is phase compared with a first reference signal.

A signal of a frequency $F_r$ from a main reference signal source 46, which is formed, for instance, by a crystal oscillator, is frequency divided down to 1/M by a frequency divider serving as the reference signal source 47, the frequency-divided output from which is applied as the first reference signal to the phase comparator 45. This example is adapted so that it is also possible to perform a frequency sweep on the basis of a set frequency. The output from the phase comparator 45 is fed via a sample-hold circuit 48 to an adder 49. To the adder 49 is supplied via a switch 52 a sawtooth sweep voltage 51a from a sweep signal source 51. The sample-hold circuit 48 and the adder 49 can be constituted in the same manner as in the prior art example shown in FIG. 2. In the case of no frequency sweep being effected, the sample-hold circuit 48 passes on the output from the phase comparator 45 to the adder 49. When it is desired to perform the frequency sweep, the switch 52 is turned ON to cause the sample-hold circuit 48 to hold the immediately preceding output from the phase comparator 45.

By the output from the adder 49 is controlled the oscillation frequency of the second VCO 53. The output from the second VCO 53, which has a frequency $F_s$, is applied to the frequency converter 54, wherein its frequency is lowered by a second local signal. To obtain the second local signal, for example, the output from the local signal source 43 is frequency divided by the frequency divider 55 and its frequency-divided output is provided as the second local signal to the frequency converter 54. Accordingly, the frequency divider 55 performs the same function as that of the local signal source 55 utilized in FIG. 7. Incidentally, the local signal source 43 has its frequency stabilized by the output from the main reference signal source 46. The output from the frequency converter 54 is applied as a reference signal to the phase comparator 56. On the other hand, the output from the first VCO 41 is frequency divided by the frequency divider 57 and its output is provided to the phase comparator 56, the phase-comparated output from which is supplied to the first VCO 41 to control its frequency.

Thusly are constituted the first PLL 58 [VCO 41-frequency converter 42-variable frequency divider 44-phase comparator 45-sample-hold circuit 48-adder 49-second VCO 53-frequency converter 54-phase comparator 56-first VCO 41] and the second PLL 59 [first VCO 41-frequency divider 57-phase comparator 56-first VCO 41].

This embodiment is designed so that signals of various frequencies can be derived. A changeover switch 61 is provided and supplied at its fixed contact 62 with the output from the frequency converter 42. The frequency divider 57 is constituted by a cascade connection of 1/10 frequency dividers 57a, 57b and 57c, and the output from the frequency divider 57a is supplied to a fixed contact 63 of the switch 61. Furthermore, the output from the frequency divider 57b and the output from the second VCO 53 can be selectively taken out via a changeover switch 65 and its output is applied to a frequency converter 66 which yields a sum frequency of two inputs thereto. On the other hand, the frequency divider 55 is also formed by a cascade connection of 1/10 frequency dividers 55a and 55b and the output from the frequency divider 55a is fed to the frequency converter 66, the output from which is, in turn, applied to a fixed contact 64 of the switch 61. The output from the switch 61 is provided as the output from the frequency synthesizer to the output terminal 67.

Letting the output frequency of the first VCO 41 be represented by $F_0$, the output frequency of the second VCO 53 by $F_s$, the reference signal frequency of the main reference signal source 46 by $F_r$, the first local signal frequency of the local signal source 43 by $F_l$, the output frequencies of the frequency converters 42 and 54 by $F_{i1}$ and $F_{i2}$, respectively, the frequency dividing factor of the variable frequency divider 44 by N, the frequency dividing factor of the frequency divider 47 by M and the frequency dividing ratios of the frequency dividers 55 and 57 by 1/100 and 1/1000, respectively, the following relations hold.

$$F_0 = 10^3 \times F_{i2} = 10^3 \times \left( F_s - \frac{F_l}{10^2} \right),$$

$$F_{01} = F_{i1} = N \times \frac{F_r}{M}, \quad F_0 = F_l + N \times \frac{F_r}{M}$$

Therefore, $$F_s = \left( \frac{1}{10^2} + \frac{1}{10^3} \right) F_l + \frac{N}{10^3} \times \frac{F_r}{M}$$

Accordingly, the frequency $F_{01}$ of the output available at the fixed contact 62 of the switch 61 is given by $$F_{01} = F_0 - F_l = N \times \frac{F_r}{M}$$

The frequency $F_{02}$ of the output at the fixed contact 63 of the switch 61 is given by $$F_{02} = \frac{F_0}{10} = \frac{1}{10} \left( F_l + N \times \frac{F_r}{M} \right)$$

The frequency $F_{03}$ of the output which is yielded at the fixed contact 64 of the switch 61 when the switch 65 is connected to the output side of the frequency divider 57b is given by $$F_{03} = \frac{F_0}{100} + \frac{F_l}{10} = \frac{1}{100} \left( F_l + N \times \frac{F_r}{M} \right) + \frac{F_l}{10}$$

Further, the frequency $F_{04}$ of the output which is derived at the fixed contact 64 when the switch 65 is connected to the output side of the second VCO 53 is given by $$F_{04} = F_s + \frac{F_l}{10} = \left( \frac{1}{10} + \frac{1}{10^2} + \frac{1}{10^3} \right) F_l + \frac{N}{10^3} \times \frac{F_r}{M}$$

For example, in the case where $F_l = 180$ MHz, $F_0 = 200$ MHz $\pm 10$ MHz, $F_r/M = 1$ KHz, $N = 10000$ to 30000 and $F_s = 2$ MHz $\pm 10$ KHz, the output frequency at the output terminal 67 can be varied over a range of $\pm 10$ MHz about 20 MHz. In the case of outputting the signal of the frequency $F_{01}$, the frequency can be varied by steps of 1 KHz by changing N; in the case of outputting the signal of the frequency $F_{02}$, the frequency can be varied by steps of 100 Hz; in the case of outputting the signal of the frequency $F_{03}$, the frequency can be varied by steps of 10 Hz; and in the case of outputting the signal of the frequency $F_{04}$, the frequency can be varied by steps of 1 Hz. In this way, the output frequency can be varied by steps of various values over the same wide range about a fixed center frequency.

Moreover, in the case of providing the sample-hold circuit 48 and the adder 49 as shown in this embodiment, it is possible to sweep the output frequency about a frequency determined by the frequency dividing factor N of the variable frequency divider 44, by setting the frequency dividing factor N and putting the sample-hold circuit 48 into its sample-hold state, followed by the switch 52 being turned ON in such a state.

In the present invention, the second VCO 53 is constituted by an oscillator which is highly stable, low-drift and excellent in linearity and the frequency is varied while holding the stability of the second VCO 53 by the first PLL 58 and the frequency variation range is multiplied by the second PLL 59; in this example, the frequency variation range is enlarged to 1000 times. Accordingly, the frequency can be varied over a wide range at short intervals and, moreover, the output frequency can be learned from the set value of the frequency dividing factor N; therefore, there is no need of measuring the output frequency by a frequency measuring instrument for each frequency variation.

In FIG. 9, it is possible to omit the switch 52 so that when no sample command is applied to the sample-hold circuit 48, the generation of the sweep signal from the sweep signal source 51 is stopped, thus outputting zero volts. A resistor 68 connected to the connection point of the adder 49 and the switch 52 is to reduce the one input to the adder 49 down to zero when the switch 52 is OFF and the resistor 68 may be substituted with a switch which is controlled in a direction opposite to the switch 52. Therefore, the output from the first VCO 41 or the frequency divider 57 may also be utilized as the output from the frequency synthesizer. Also in the embodiments of FIGS. 5 to 8, it is possible to provide the sample-hold circuit 48, the adder 49 and the sweep signal source 51 on the input side of the second VCO 53 as in the case of FIG. 9, whereby to perform frequency sweep on the basis of a frequency set by the variable frequency divider 44. Besides, it is also possible, in FIG. 9, that the local signals to the frequency converters 42 and 54 and the reference signal to the phase comparator 45 are supplied from individual signal sources. At any rate, these local signals and the reference signal are made higher in frequency stability than the output from the second VCO 53.

It will be apparent that many modifications and variations may be effected without departing from the scope of the novel concepts of the present invention.

What is claimed is:

1. A frequency synthesizer comprising
   a first variable frequency oscillator capable of changing its oscillation frequency by a control signal;
   a first frequency divider connected to the output of the first variable frequency oscillator for frequency dividing its oscillation output;
   a variable frequency divider also connected to the output of the first variable frequency oscillator for frequency dividing its oscillation output by a selectively variable frequency dividing ratio;
   a first reference signal source for generating a first reference signal of a predetermined frequency;
   a first phase comparator connected to the output of the first reference signal source and the variable frequency divider for phase comparing the first reference signal and the output from the variable frequency divider;
   a second variable frequency oscillator connected to the output of the first phase comparator so that the oscillation frequency of the second variable frequency oscillator is controlled by the output from the first phase comparator, the second variable frequency oscillator being superior in frequency stability and in the linearity of its oscillation frequency variation with respect to variation in the control signal than the first variable frequency oscillator, and the frequency stability of the first reference signal source being better than the frequency stability of the second variable frequency oscillator;
   a second phase comparator connected to the output of the second variable frequency oscillator and the first frequency divider for phase comparing the oscillation output from the former and the frequency-divided output from the latter and applying the compared output as a control signal to the first variable frequency oscillator;
   a first local signal source of higher frequency stability than that of the second variable frequency oscillator for generating a first local signal of a predetermined frequency; and
   a first frequency converter connected to the outputs of the first variable frequency oscillator and the first local signal source for converting the output from the first variable frequency oscillator into a lower-frequency signal by the first local signal and supplying the lower-frequency signal to the variable frequency divider.

2. A frequency synthesizer according to claim 1 wherein the second-variable frequency oscillator comprises first and second variable frequency oscillator means connected to the output of the first phase comparator, the oscillation frequencies of the first and second variable frequency oscillator means being controlled by the output from the first phase comparator in opposite directions; and frequency converter means connected to the outputs of the first and second variable frequency oscillator means and supplied with the oscillation outputs therefrom to provide a signal of the difference frequency as the output from the second variable frequency oscillator.

3. A frequency synthesizer according to claim 1 further comprising a second local signal source of higher frequency stability than that of the second variable frequency oscillator for generating a second local signal of a predetermined frequency; and a second frequency converter connected to the outputs of the second local signal source and the second variable frequency oscillator for converting the output from the second variable frequency oscillator by the second local signal into a lower-frequency signal and supplying it to the second phase comparator.

4. A frequency synthesizer according to claim 2 or 3 wherein a main reference signal source is provided for generating a main reference signal of a highly stable frequency; the main reference signal from the main reference signal source is applied to each of the first reference signal source and the first local signal source so that the first reference signal source and the first local signal source respectively produce the first reference signal and the first local signal on the basis of the frequency of the main reference signal.

5. A frequency synthesizer according to claim 3 wherein a main reference signal source is provided for generating a main reference signal of a highly stable frequency; the main reference signal from the main reference signal source is applied to each of the first reference signal source, the first local signal source and the second local signal source so that the first reference signal source, the first local signal source and the second local signal source respectively produce the first reference signal, the first local signal and the second local signal on the basis of the frequency of the main reference signal.

6. A frequency synthesizer according to claim 5, said first frequency divider comprising plural stages, including stages corresponding to frequency division of 1/10 and 1/100, said synthesizer further comprising a first changeover switch for selectively deriving the output from the 1/100 dividing stage of said first frequency divider and the output from said second variable frequency oscillator, means for providing a third local signal on the basis of the frequency of said main reference signal, a third frequency converter supplied with the output from said first changeover switch and the third local signal for frequency mixing thereof, and an output changeover switch for selectively outputting one of the outputs from said third frequency converter, said first frequency converter and from the 1/10 dividing stage of said first frequency divider.

7. A frequency synthesizer according to claim 6 further comprising a sweep signal source for generating a sweep signal; a sample-hold circuit inserted to receive as an input the output of the first phase comparator, including means for normally outputting the input thereto and, upon reception of a sample-hold command, for holding and continuing to output the output at the time of said reception; an adder connected to the output of the sample-hold circuit and the sweep signal source for adding the output from the sample-hold circuit and the sweep signal and supplying the added output as a control signal to the second variable frequency oscillator; and means for supplying the sweep signal of the sweep signal source to the adder during application of the sample-hold command to the sample-hold circuit and stopping the supply of the sweep signal of the sweep signal source to the adder when the sample-hold command to the sample-hold circuit is removed.

8. A frequency synthesizer according to claim 6 or 7 wherein the frequency of said first local signal is 180 MHz, the frequency of said second local signal is 1.8 MHz, the frequency of said third local signal is 18 MHz, the frequency of said first reference signal is 1 KHz, the dividing factor of said variable frequency divider is in the range from 10000 to 30000, and said third frequency converter is arranged to produce a sum frequency of the output from said first changeover switch and the third local signal.

9. A frequency synthesizer comprising
a first variable frequency oscillator capable of changing its oscillation frequency by a control signal;
a first frequency divider connected to the output of the first variable frequency oscillator for frequency dividing its oscillation output;
a variable frequency divider also connected to the output of the first variable frequency oscillator for frequency dividing its oscillation output by a selectively variable frequency dividing ratio;
a first reference signal source for generating a first reference signal of a predetermined frequency;
a first phase comparator connected to the output of the first reference signal source and the variable frequency divider for phase comparing the first reference signal and the output from the variable frequency divider;
a second variable frequency oscillator connected to the output of the first phase comparator so that the oscillation frequency of the second variable frequency oscillator is controlled by the output from the first phase comparator, the second variable frequency oscillator being superior in frequency stability and in the linearity of its oscillation frequency variation to variation with respect in the control signal than the first variable frequency oscillator, and the frequency stability of the first reference signal source being better than the frequency stability of the second variable frequency oscillator;
a second phase comparator connected to the output of the second variable frequency oscillator and the first frequency divider for phase comparing the oscillation output from the former and the frequency-divided output from the latter and applying the compared output as a control signal to the first variable frequency oscillator;
a first local signal source of higher frequency stability than that of the second variable frequency oscillator for generating a first local signal of a predetermined frequency; and
a first frequency converter connected to the outputs of said first local signal source and the second variable frequency oscillator for converting the output from the second variable frequency oscillator by the first local signal into a lower-frequency signal and supplying it to the second phase comparator.

10. A frequency synthesizer according to claim 9 wherein a main reference signal source is provided for generating a main reference signal of a highly stable frequency; the main reference signal from the main reference signal source is applied to each of the first reference signal source and said first local signal source; and the first reference signal source and said first local signal source respectively yield the first reference signal and paid first local signal on the basis of the frequency of the main reference signal.

11. A frequency synthesizer according to claim 1, 2, 3 or 9 further comprising a sweep signal source for generating a sweep signal; a sample-hold circuit inserted to receive as an input the output of the first phase comparator, including means for normally outputting the input thereto and, upon reception of a sample-hold command, for holding and continuing to output the output at the time of said reception; an adder connected to the output of the sample-hold circuit and the sweep signal source for adding the output from the sample-hold circuit and the sweep signal and supplying the added output as a control signal to the second variable frequency oscillator; and means for supplying the sweep signal of the sweep signal source to the adder during application of the sample-hold command to the sample-hold circuit and for stopping the supply of the sweep signal of the sweep signal source to the adder when the sample-hold command to the sample-hold circuit is removed.

12. A frequency synthesizer according to claim 11 further comprising an output changeover switch for selectively providing each of a predetermined plurality of outputs selected from the first and second variable frequency oscillators, their frequency converted outputs and at least one frequency divided output of the first divider, corresponding to a respective frequency division herein.

13. A frequency synthesizer according to claim 12 wherein the first frequency divider comprises plural intermediate dividing stages, and a plurality of frequency-divided outputs are taken from selected ones of the intermediate dividing stages.

14. A frequency synthesizer according to claim 12 wherein the plurality of selected outputs are selected so that they have the same center frequency.

15. A frequency synthesizer according to claim 1, 2, 3 or 9 further comprising an output changeover switch for selectively providing each of a predetermined plurality of outputs selected from the first and second variable frequency oscillators, their frequency-converted outputs and at least one frequency divided output of the first frequency divider corresponding to a respective frequency division therein.

* * * * *

UNITED STATES PATENT AND TRADEMARK OFFICE
CERTIFICATE OF CORRECTION

PATENT NO. : 4,488,123
DATED : 11 December 1984
INVENTOR(S) : Takenori Kurihara

It is certified that error appears in the above-identified patent and that said Letters Patent is hereby corrected as shown below:

Column 1, line 55, "before" should be --both--.

Column 8, line 16, "purposes so that," should be --purposes, so that--.

Column 13, line 47 delete "to variation"; after "with respect" insert --to variation--.

Column 14, line 17, "paid" should be --said--.

Signed and Sealed this

Sixteenth Day of July 1985

[SEAL]

Attest:

DONALD J. QUIGG

Attesting Officer

Acting Commissioner of Patents and Trademarks